(12) United States Patent
Ookawa et al.

(10) Patent No.: US 8,522,427 B2
(45) Date of Patent: Sep. 3, 2013

(54) METHOD OF MANUFACTURING A PRINTED CIRCUIT BOARD

(75) Inventors: Tadao Ookawa, Ibaraki (JP); Mitsuru Honjo, Ibaraki (JP); Takashi Oda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 599 days.

(21) Appl. No.: 12/345,134

(22) Filed: Dec. 29, 2008

(65) Prior Publication Data

US 2009/0106975 A1 Apr. 30, 2009

Related U.S. Application Data

(62) Division of application No. 11/280,624, filed on Nov. 16, 2005, now Pat. No. 7,521,779.

(30) Foreign Application Priority Data

Nov. 26, 2004 (JP) ................. 2004-342178

(51) Int. Cl.
*H05K 3/02* (2006.01)
*H05K 3/10* (2006.01)

(52) U.S. Cl.
USPC .............. 29/846; 29/825; 29/831; 216/17; 216/36

(58) Field of Classification Search
USPC ............... 29/846, 814, 825, 831, 840, 852; 427/97.2, 97.5, 98.1, 98.8, 536, 558; 216/17, 216/20, 36
See application file for complete search history.

(56) References Cited

U.S. PATENT DOCUMENTS

| | | | |
|---|---|---|---|
| 4,063,701 A | 12/1977 | Wray | |
| 4,963,701 A | 10/1990 | Yasumoto et al. | |
| 5,055,321 A * | 10/1991 | Enomoto et al. | ............. 427/97.2 |
| 5,517,758 A * | 5/1996 | Nakamura | ....................... 29/852 |
| 5,690,837 A * | 11/1997 | Nakaso et al. | .................. 216/17 |
| 5,830,563 A | 11/1998 | Shimoto et al. | |
| 6,040,039 A | 3/2000 | Ikeda et al. | |
| 6,525,921 B1 | 2/2003 | Nakatani et al. | |
| 6,591,495 B2 | 7/2003 | Hirose et al. | |
| 6,753,480 B2 | 6/2004 | Maa et al. | |
| 6,924,043 B2 | 8/2005 | Suzuki et al. | |

(Continued)

FOREIGN PATENT DOCUMENTS

| | | |
|---|---|---|
| CN | 1454045 A | 11/2003 |
| CN | 1747630 A | 3/2006 |

(Continued)

*Primary Examiner* — Thiem Phan
(74) *Attorney, Agent, or Firm* — Panitch Schwarze Belisario & Nadel LLP

(57) ABSTRACT

A multi-layer structure including a base insulating layer and a thin metal film layer (seed layer) is prepared. A plating resist layer is formed to have a prescribed pattern on the upper surface of the thin metal film layer. A metal plating layer is formed on the thin metal film layer exposed by electroplating. Then, the plating resist layer is removed, and the thin metal film layer in the region having the plating resist layer is removed. In this way, a conductive pattern including the thin metal film layer and the metal plating layer is formed. The upper surface of the base insulating layer in the region without the conductive pattern is subjected to roughening treatment. A cover insulating layer is formed on the upper surfaces of the base insulating layer and the conductive pattern. In this way, a printed circuit board is completed.

5 Claims, 5 Drawing Sheets

(56) References Cited

U.S. PATENT DOCUMENTS

| | | |
|---|---|---|
| 6,964,884 B1 | 11/2005 | Chan et al. |
| 7,031,166 B2 | 4/2006 | Imamura et al. |
| 7,189,650 B2 | 3/2007 | Liu et al. |
| 2003/0203171 A1 | 10/2003 | Higashitani |
| 2004/0151883 A1 | 8/2004 | Higashitani |
| 2004/0151884 A1 | 8/2004 | Higashitani |
| 2004/0202781 A1 | 10/2004 | Higashitani |
| 2004/0237295 A1 | 12/2004 | Wakizaka et al. |
| 2005/0040535 A1 | 2/2005 | Kawata et al. |
| 2005/0073047 A1 | 4/2005 | Miura |
| 2005/0258522 A1 | 11/2005 | En et al. |
| 2006/0056162 A1 | 3/2006 | Koide |
| 2006/0078669 A1 | 4/2006 | Sugaya et al. |
| 2006/0163559 A1 | 7/2006 | Koganei et al. |
| 2006/0199353 A1 | 9/2006 | Kub et al. |

FOREIGN PATENT DOCUMENTS

| | | |
|---|---|---|
| CN | 1805653 B | 7/2010 |
| EP | 1357773 A2 | 10/2003 |
| EP | 1635625 A2 | 3/2006 |
| JP | 08134666 A | 5/1996 |
| JP | 11-061054 A | 3/1999 |
| JP | 2001-007513 A | 1/2001 |
| JP | 2001007513 A | 1/2001 |
| JP | 2001259411 A | 10/2001 |
| JP | 2002-185132 A | 6/2002 |
| JP | 2002-252257 A | 9/2002 |
| JP | 2002-368393 A | 12/2002 |
| JP | 2003-198120 A | 7/2003 |
| JP | 2005-086071 A | 3/2005 |

* cited by examiner

METHOD OF MANUFACTURING A PRINTED CIRCUIT BOARD

CROSS-REFERENCE TO RELATED APPLICATIONS

This application is a Divisional of U.S. patent application Ser. No. 11/280,624, filed Nov. 16, 2005, and the disclosure of which is incorporated herein by reference.

BACKGROUND OF THE INVENTION

1. Field of the Invention

The invention relates to a printed circuit board and a manufacturing method thereof.

2. Description of the Related Art

As a method of manufacturing a printed circuit board, a subtractive method, an additive method, and a semi-additive method are known.

For example, a printed circuit board is manufactured according to the subtractive method as follows (see Japanese Patent Laid-Open No. 2002-252257). To start with, a thin metal film is formed as an adhesion promoting layer (seed layer) by sputtering on a base insulating layer such as a polyimide film. Then, a metal plating layer is formed on the thin metal film.

The metal plating layer is then coated with photoresist in a prescribed pattern, followed by drying, and then subjected to process of exposure, development, and etching. Then, the photoresist is removed and a complete conductive (interconnection) pattern forms.

In another example, a printed circuit board is manufactured according to the semi-additive method as follows (see Japanese Patent Laid-Open No. 2002-368393). To start with, a thin copper film is formed on a base insulating layer by sputtering. Then, a plating resist pattern is formed to expose a predetermined interconnection part of the thin copper film. Then, the exposed part of the thin copper film is provided with electrolytic nickel plating, and then the plating resist pattern and the thin copper film in the region of the plating resist pattern are removed. In this way, a complete conductive pattern forms.

In some cases, when the thus produced printed circuit board is used in a high temperature and high humidity atmosphere, ion migration of the conductor (copper in the above example) is caused along the boundary between the base insulating layer and a cover insulating layer formed on a surface of the base insulating layer having the conductive pattern thereon. This short-circuits conductive patterns formed as interconnections.

Herein, the ion migration refers to the movement of metal ions (copper ions in the above example) through water as a medium while an electric field is generated.

SUMMARY OF THE INVENTION

It is an object of the invention to provide a printed circuit board that can sufficiently prevent ion migration of a conductor in a high temperature and high humidity atmosphere and a manufacturing method thereof.

(1) A printed circuit board according to one aspect of the invention includes an insulating layer, and a conductive layer provided on one or both surfaces of the insulating layer and having a prescribed pattern. The region excluding the conductive layer on the surface of the insulating layer that has the conductive layer thereon is roughened.

In the printed circuit board according to the invention, the region excluding the conductive layer is roughened on the surface of the insulating layer having the conductive layer thereon, so that irregularities forms on the insulating layer. In this way, in a high temperature and high humidity atmosphere, the movement of metal ions eluted from the conductive layer is limited by the irregularities on the insulating layer. When another insulating layer is provided to cover the surface of the insulating layer having the conductive layer thereon, the adhesion between these insulating layers improves, and the movement of the metal ions is further limited. Consequently, ion migration of the conductive layer can sufficiently be prevented in the high temperature and high humidity atmosphere.

(2) The conductive layer may include a thin metal film layer provided in contact with the insulating layer. This makes it easier to form a metal plating layer on one or both surfaces of the insulating layer.

(3) The surface roughness of the insulating layer in the region excluding the conductive layer may be at least 0.1 μm. In this way, ion migration of the conductive layer can sufficiently be prevented in a high temperature and high humidity atmosphere.

(4) The conductive layer may include a thin metal film layer provided in contact with the insulating layer, and the surface roughness of the insulating layer in the region excluding the conductive layer may be at least 0.1 μm. The thin metal film layer makes it easier to form a metal plating layer on one or both surfaces of the insulating layer. The surface roughness of the insulating layer in the region excluding the conductive layer is at least 0.1 μm and therefore ion migration of the conductive layer can sufficiently be prevented in a high temperature and high humidity atmosphere.

(5) The insulating layer may have flexibility. In this way, a flexible printed circuit board is manufactured. Therefore, the printed circuit board thus manufactured may find application in various fields of electronic equipment and information related equipment.

(6) A method of manufacturing a printed circuit board according to another aspect of the invention includes the steps of forming a conductive layer having a prescribed pattern on one or both surfaces of an insulating layer, and roughening the region excluding the conductive layer on the surface of the insulating layer having the conductive layer thereon.

By the method of manufacturing a printed circuit board according to the invention, a conductive layer having a prescribed pattern is formed on one or both surfaces of an insulating layer, and the region excluding the conductive layer on the surface of the insulating layer having the conductive layer thereon is roughened.

In this way, the region excluding the conductive layer on the surface of the insulating layer having the conductive layer thereon is roughened, so that irregularities form on the insulating film. Therefore, in a high temperature and high humidity atmosphere, the movement of metal ions eluted from the conductive layer is limited by the irregularities on the insulating layer. When in particular another insulating layer is provided to cover the surface of the insulating layer having the conductive layer thereon, the adhesion between these insulating layers improves, and the movement of the metal ions is further limited. Consequently, ion migration of the conductive layer can sufficiently be prevented in the high temperature and high humidity atmosphere.

(7) The step of roughening the region excluding the conductive layer may include the step of roughening the insulating layer positioned in the region excluding the conductive layer by wet etching, wet blasting, or dry etching process.

In this way, at the time of roughening the insulating layer positioned in the region excluding the conductive layer, the wet etching, wet blasting or dry etching process may selectively be employed depending on the materials of the insulating layer and the conductive layer and the like, so that the region excluding the conductive layer can readily be roughened.

(8) The step of forming a conductive layer having a prescribed pattern may include the step of forming the conductive layer including a thin metal film layer so that the thin metal film layer is in contact with one or both surfaces of the insulating layer. This makes it easier to form a metal plating layer on one or both surfaces of the insulating layer.

According to the invention, the region excluding the conductive layer on the surface of the insulating layer having the conductive layer thereon is roughened, and irregularities form on the insulating layer. In this way, in a high temperature and high humidity atmosphere, the movement of metal ions eluted from the conductive layer is limited by the irregularities on the insulating layer. When in particular another insulating layer is provided to cover the surface of the insulating layer having the conductive layer thereon, the adhesion between these insulating layers improves, and the movement of the metal ions is further limited. Consequently, ion migration of the conductive layer can sufficiently be prevented in the high temperature and high humidity atmosphere.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Figure 1:
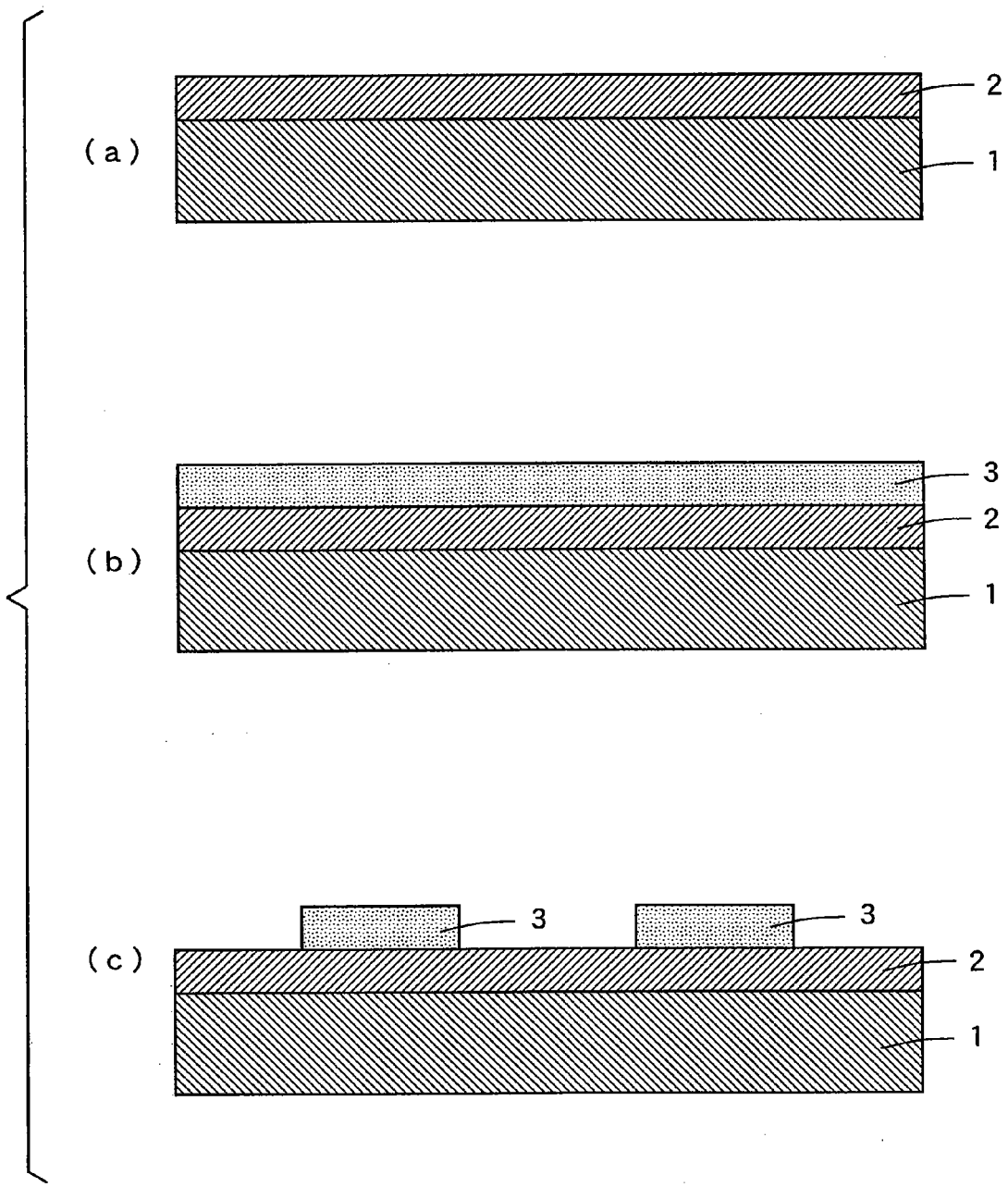
FIGS. 1(a) to 1(c) are views for use in illustrating a method of manufacturing a printed circuit board according to one embodiment of the invention.
Figure 2:
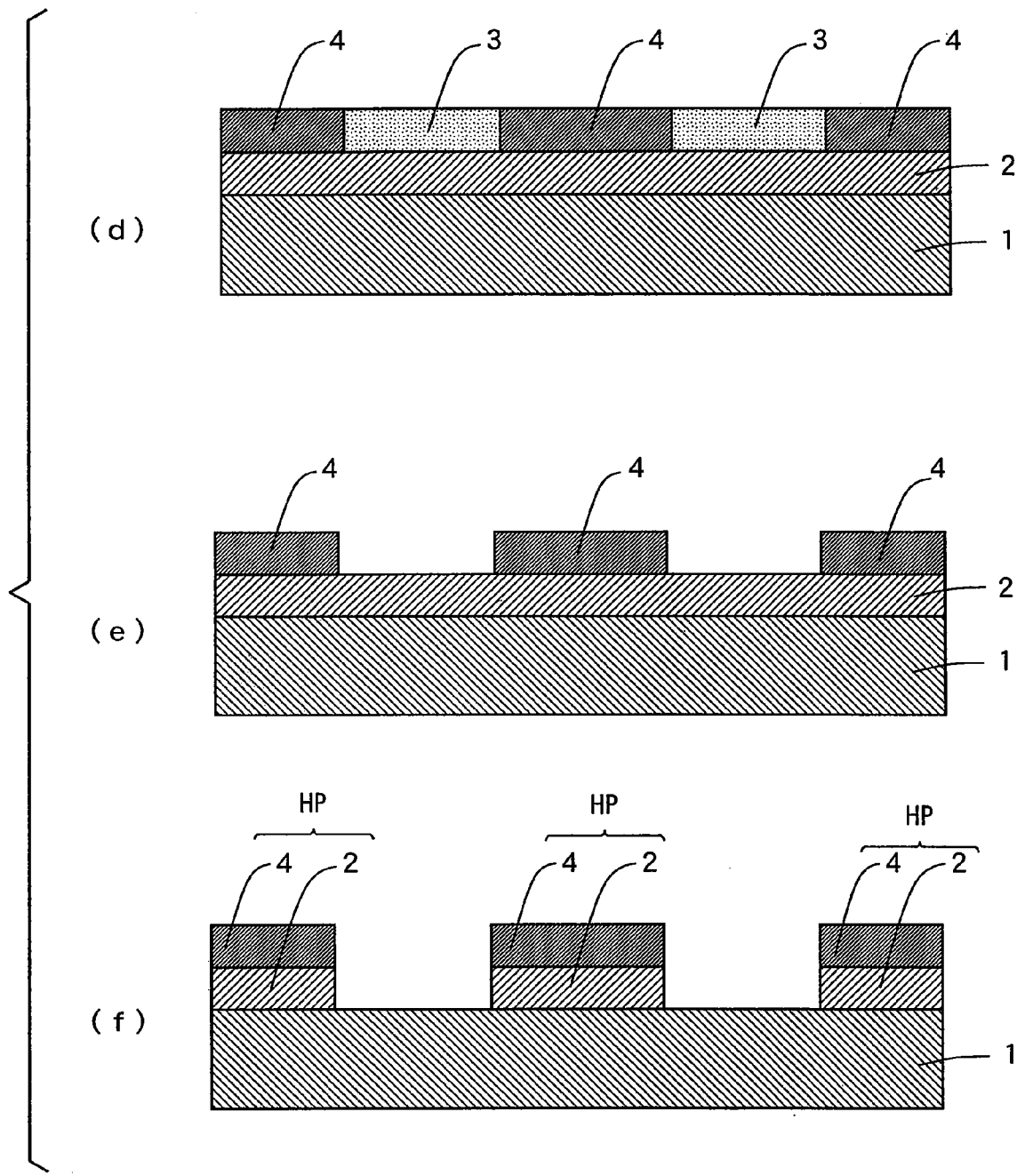
FIG. 2(d) to 2(f) are views for use in illustrating the method of manufacturing the printed circuit board according to the embodiment of the invention.
Figure 3:
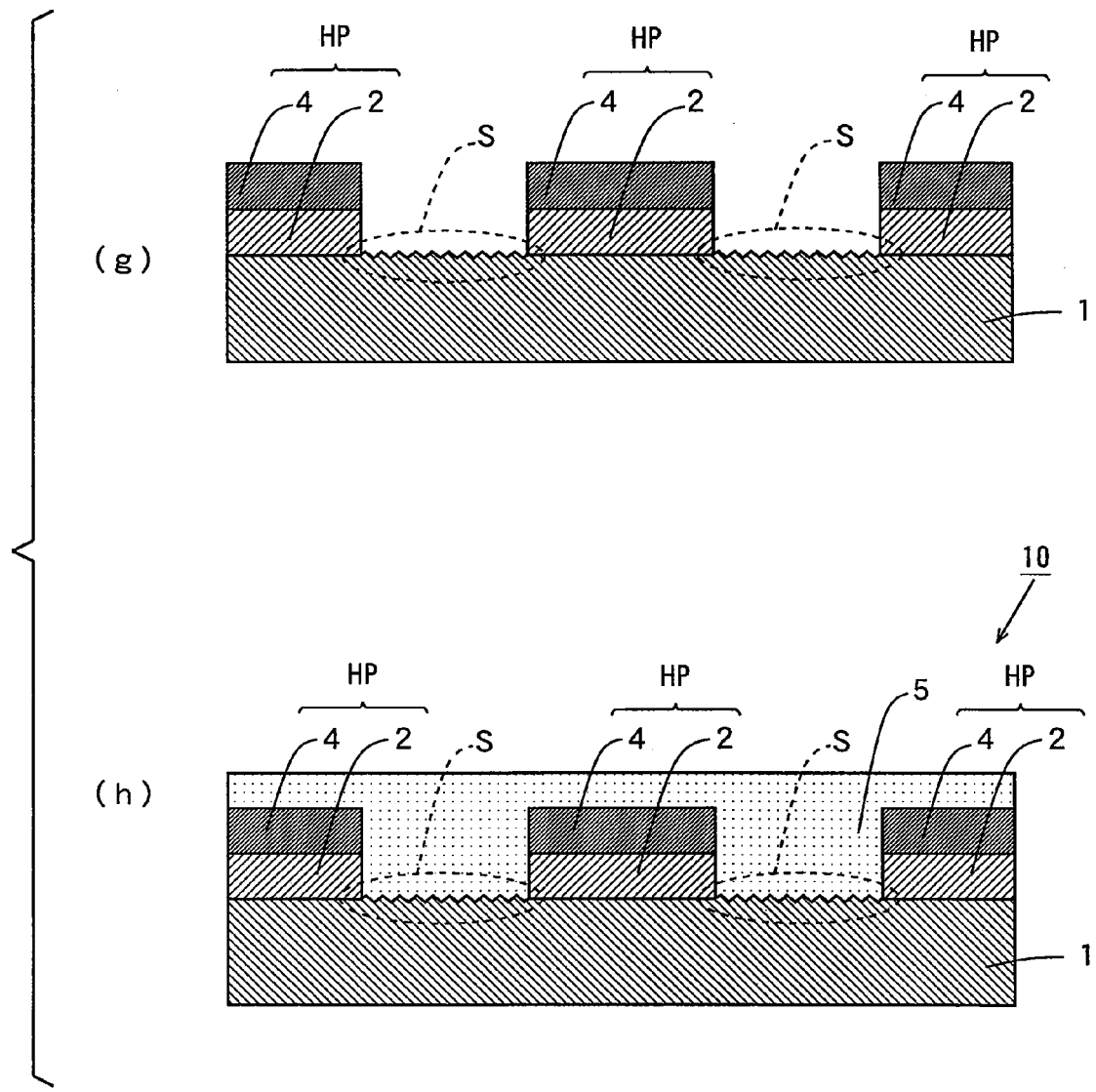
FIGS. 3(g) and 3(h) are views for use in illustrating the method of manufacturing the printed circuit board according to the embodiment of the invention.

Now, a printed circuit board according to one embodiment of the invention and a manufacturing method thereof will be described. In the following description, the printed circuit board refers for example to a printed circuit board having flexibility (flexible printed circuit board).

FIG. 1(a) to FIG. 3(h) are views for use in illustrating a method of manufacturing a printed circuit board according to the embodiment.

As shown in FIG. 1(a), a multi-layer structure including a base insulating layer 1 having a thickness of 5 μm to 50 μm and a thin metal film layer (seed layer) 2 having a prescribed thickness is prepared. The base insulating layer 1 has flexibility. Note that the base insulating layer 1 preferably has a thickness from 10 μm to 30 μm.

As shown in FIG. 1(b), a plating resist layer 3 for example of photosensitive resin is formed on one surface (hereinafter referred to as "upper surface") of the thin metal film layer 2. Then, as shown in FIG. 1(c), the plating resist layer 3 is subjected to exposure and development process using a prescribed pattern. In this way, the plating resist layer 3 having the prescribed pattern is formed on the thin metal film layer 2. Then, the part of the thin metal film layer 2 corresponding to the interconnection pattern is exposed.

Note that the plating resist layer 3 may be formed of a material other than the photosensitive resin as far as the material can be formed into the prescribed pattern on the thin metal film layer 2.

Then, as shown in FIG. 2(d), a metal plating layer 4 is formed on the thin metal film layer 2 exposed by electroplating. The metal plating layer 4 may be for example of nickel, copper, gold, or a solder material.

As shown in FIG. 2(e), the plating resist layer 3 is removed, and the thin metal film layer 2 in the region of the plating resist layer 3 is removed. In this way, as shown in FIG. 2(f), conductive patterns HP including the thin metal film layer 2 and the metal plating layer 4 are formed. The conductive patterns HP preferably have a thickness in the range from 5 μm to 30 μm, more preferably from 5 μm to 15 μm. When the conductive patterns HP are sufficiently thin, the resulting printed circuit board has flexibility.

Now, according to the embodiment, as shown in FIG. 3(g), the upper surface of the base insulating layer 1 in a region S without the conductive patterns HP is roughened, i.e., a major surface of the insulating layer 1 is roughened only in a region of the major surface where the conductive patterns HP are not present. The surface may be roughened for example by wet etching or wet blasting process using an acid or alkaline liquid. Dry etching process such as sputtering and plasma etching may be employed.

The surface roughness of the region S resulting from the roughing process is preferably in the range from 0.1 μm to 0.5 μm. The surface roughness is based on the surface roughness (Ra) defined by "JIS (Japanese Industrial Standard) B0601."

As shown in FIG. 3(h), a cover insulating layer 5 is then formed on the upper surface of the base insulating layer 1 and on the conductive patterns HP. The thickness of the cover insulating layer 5 is preferably in the range from 3 μm to 30 μm, more preferably from 5 μm to 30 μm.

In this way, the printed circuit board 10 according to the embodiment is completed.

In the printed circuit board 10 described above, an adhesive layer may be provided as required between the base insulating layer 1 and the conductive patterns HP and between the conductive patterns HP and the cover insulating layer 5. In this case, the thickness of the adhesive layer is preferably in the range from 5 μm to 50 μm, more preferably from 10 μm to 20 μm.

The conductive patterns HP of the printed circuit board 10 have a two-layer structure including the thin metal film layer 2 and the metal plating layer 4, but the conductive patterns HP may have a single-layer structure or a multi-layer structure consisting of two or more layers.

In the foregoing, how the conductive patterns HP are formed by the semi-additive method has been described, while the conductive patterns HP may be formed either by the additive method or the subtractive method.

In the printed circuit board 10 according to the embodiment, the region S of the base insulating layer 1 having the conductive patterns HP thereon is roughened excluding the location of the conductive patterns HP, so that irregularities form on the base insulating layer 1. In a high temperature and high humidity atmosphere, the movement of metal ions (copper ions) eluted from the conductive patterns HP is limited by the irregularities on the base insulating layer 1. According to the embodiment, the cover insulating layer 5 is provided on the surface of the base insulating layer 1 having the conductive patterns HP thereon to cover the surface, so that the base insulating layer 1 and the cover insulating layer 5 are more tightly adhered with each other, which further limits the movement of the metal ions. Consequently, ion migration in the conductive patterns HP can sufficiently be prevented in the high temperature and high humidity atmosphere.

As described above, according to the embodiment, the conductive patterns HP include the thin metal film layer 2 provided in contact with the base insulating layer 1. In this way, the thin metal film layer 2 makes it easier to form the metal plating layer 4 on one or both surfaces of the base insulating layer 1.

The surface roughness of the base insulating layer 1 in the region S excluding the conductive patterns HP is preferably not less than 0.1 µm. In this way, ion migration in the conductive layer can sufficiently be prevented in the high temperature and high humidity atmosphere.

Note that no surface roughening treatment is carried out to the region other than the region S on the upper surface of the base insulating layer 1, in other words, to the region where the conductive patterns HP are formed. In this way, there is no irregularity at the interface between the base insulating layer 1 and the conductive patterns HP, so that the transmission loss regarding electrical signals at the surface of the conductive patterns HP can be reduced.

Figure 5:
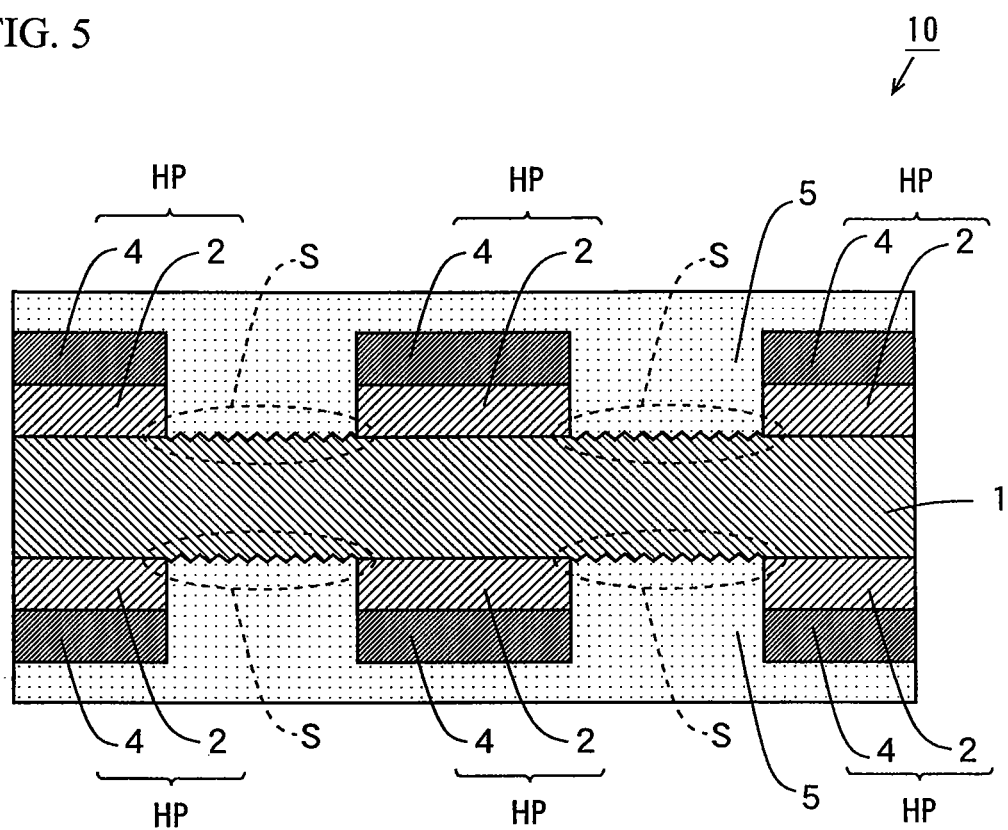
FIG. 5 is a schematic view of a printed circuit board similar to FIG. 4(a) according to another embodiment of the invention with a conductive layer on each surface of the insulating layer.

Furthermore, when the conductive patterns HP are formed on the upper and lower surfaces of the base insulating layer 1, as seen in FIG. 5, the base insulating layer 1 positioned between the upper and lower conductive patterns HP serves as a capacitor. In this case, the presence of irregularities at the interface between the base insulating layer 1 and the conductive patterns HP would cause variation in the capacitance value. This makes designing of the printed circuit board 10 difficult.

In contrast, in the printed circuit board 10 according to the embodiment, there is no irregularity at the interface between the base insulating layer 1 and the conductive patterns HP, and therefore variation is not caused in the capacitance value of the base insulating layer 1. Consequently, designing of the printed circuit board 10 is easy.

According to the embodiment, the thin metal film layer 2 is formed as a part of the conductive patterns HP on the base insulating layer 1. By the semi-additive method as described above in general, the thin metal film layer 2 is formed on the base insulating layer 1 in order to form the metal plating layer 4 for the conductive patterns HP.

In the printed circuit board 10 according to the embodiment, irregularities are formed on the base insulating layer 1 between the conductive patterns HP, and therefore the movement of eluted metal ions is prevented by the irregularities on the base insulating layer 1. As a result, ion migration of the conductive patterns HP can sufficiently be prevented.

Therefore, the invention is particularly advantageously applied to the printed circuit board 10 having the thin metal film layer 2 as the conductive patterns HP.

In the printed circuit board according to the embodiment, the conductive patterns HP correspond to the conductive layer.

EXAMPLES

Now, printed circuit boards according to Inventive Example 1 and Comparative Example 1 were produced based on the printed circuit board and the manufacturing method thereof as described above.

Figure 4:
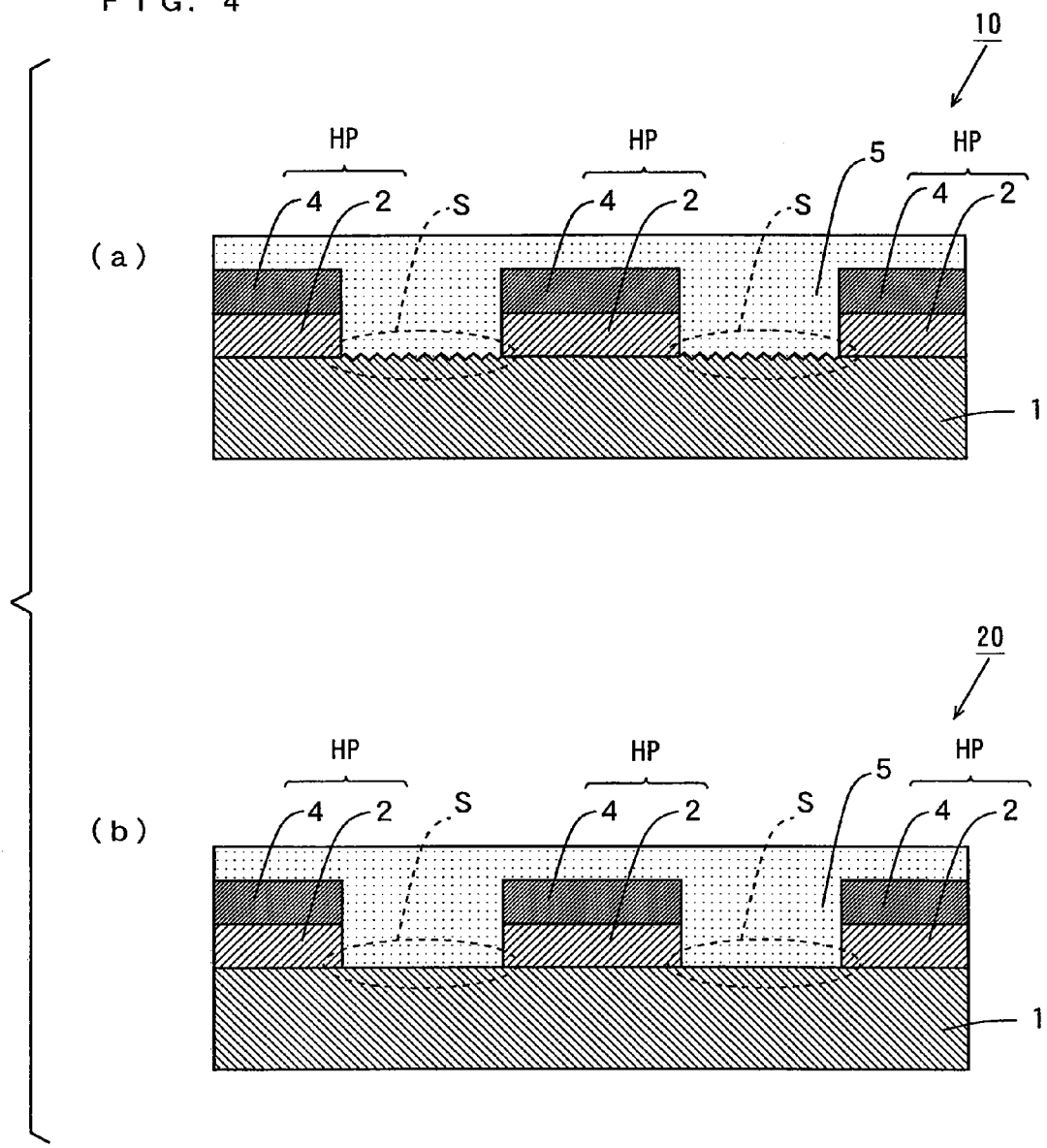
FIGS. 4(a) and 4(b) are schematic views of printed circuit boards according to Inventive Example 1 and Comparative Example 1.

FIG. 4(a) is a schematic sectional view of a printed circuit board 10 according to Inventive Example 1, and FIG. 4(b) is a schematic sectional view of a printed circuit board 20 according to Comparative Example 1.

Inventive Example 1

When the printed circuit board 10 according to Inventive Example 1 was produced, conductive patterns HP were formed according to the semi-additive method similarly to the above example, details of which will be described.

To start with, a polyimide resin film having a thickness of 25 µm was prepared as a base insulating layer 1. A sputtering film of nickel and a sputtering film of copper were formed as a thin metal film layer 2 on the upper surface of the base insulating layer 1 by continuous sputtering. In this case, the nickel sputtering layer had a thickness of 30 nm and the copper sputtering film had a thickness of 200 nm.

Then, a plating resist layer 3 made of photosensitive resin was formed on the upper surface of the thin metal film layer 2. Then, the plating resist layer 3 was subjected to exposure and development treatment using a prescribed pattern. In this way, the plating resist layer 3 having the prescribed pattern was formed on the thin metal film layer 2.

Then, a copper plating layer having a thickness of 10 µm was formed as a metal plating layer 4 on the thin metal film layer 2 exposed by the electroplating. Then, the plating resist layer 3 was removed and the thin metal film layer 2 in the region of the plating resist layer 3 was removed.

In this way, conductive patterns HP including the thin metal film layer 2 and the metal plating layer 4 were formed.

Then, roughening treatment was carried out to the upper surface of the base insulating layer 1 in the region S without the conductive patterns HP. The roughening treatment was performed by plasma etching.

Plasma system PWB-4 manufactured by APS Corporation was used. As the treatment conditions, the frequency was set to 40 kHz and the gas ratio between oxygen and argon was set to be 50%:50%. The pressure was set to 200 mTorr, the power was set to 3000 W, and the electrode temperature was set to 45° C.

After the roughening treatment described above, the surface roughness in the region S of the base insulating layer 1 was 0.1 µm. Note that the surface roughness was based on the surface roughness (Ra) defined by "JIS (Japanese Industrial Standard) B0601."

Finally, a polyimide resin film having a thickness of 25 µm was attached as a cover insulating layer 5 to the base insulating layer 1 and the upper surface of the conductive patterns HP through an adhesive layer having a thickness of 15 µm. In this way, the printed circuit board 10 according to Inventive Example 1 was completed.

Comparative Example 1

The printed circuit board 20 according to Comparative Example 1 is different from the printed circuit board 10 according to Inventive Example 1 in the following points. As shown in FIG. 4(b), in the printed circuit board 20 according to Comparative Example 1, the region S on the upper surface of the base insulating layer 1 was not subjected to the roughening treatment.

Evaluation

The printed circuit boards 10 and 20 according to Inventive Example 1 and Comparative Example 1 were kept in an atmosphere at a temperature of 60° C. and a humidity of 95% while a voltage at 30 V continued to be applied, and variation in the insulation resistance value between conductive patterns HP with time was measured. The measurement was carried out using an ion migration evaluation system manufactured by Espec Corporation.

In the above described high temperature and high humidity atmosphere, the initial insulation resistance values in Inventive Example 1 and Comparative Example 1 were both $1 \times 10^9 \Omega$.

The insulation resistance value between the conductive patterns HP according to Inventive Example 1 was $1 \times 10^8 \Omega$ or more after 1000 hours. In contrast, the insulation resistance value between the conductive patterns HP according to Comparative Example 1 was $1 \times 10^6 \Omega$ or lower after 100 hours, and an insulation failure was caused.

As can be understood from the results, it can be considered that when the region S on the upper surface of the base insulating layer 1 is subjected to roughening treatment, the movement of metal ions (copper ions) eluted from the conductive patterns HP is prevented by the irregularities on the base insulation layer 1, in other words, ion migration by the conductive patterns HP can be prevented. The cover insulating layer 5 is provided to cover the surface of the base insulating layer 1 having the conductive patterns HP thereon, so that the adhesion between the base insulating layer 1 and the cover insulating layer 5 improves, which can further prevent the movement of metal ions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a printed circuit board, comprising the steps of:
   forming a conductive layer having a prescribed pattern on one or both major surfaces of a first insulating layer, the conductive layer including a metal plating layer formed on a thin metal film layer;
   roughening the major surface of said first insulating layer having said conductive layer thereon after the step of forming the conductive layer having the prescribed pattern, said roughening taking place only in a region of the major surface of said first insulating layer where the conductive layer is not present, a surface roughness of the roughened region of the major surface of the first insulating layer being at least 0.1 µm; and
   forming a second insulating layer on the one or both major surfaces of said first insulating layer such that said second insulating layer covers said conductive layer and comes into contact with the roughened region of the major surface of said first insulating layer.

2. The method according to claim 1, wherein said step of roughening comprises the step of roughening said first insulating layer by wet etching, wet blasting or dry etching process.

3. The method according to claim 1, wherein said step of forming a conductive layer having a prescribed pattern comprises the step of forming said conductive layer including a thin metal film layer so that said thin metal film layer is in contact with one or both surfaces of said first insulating layer.

4. A method of manufacturing a printed circuit board, comprising the steps of:
   forming a conductive layer having a prescribed pattern on at least one of two major surfaces of a first insulating layer such that said at least one of the two major surfaces of said first insulating layer comprises at least one area where said conductive layer is present and at least one area where said conductive layer is not present, the conductive layer including a metal plating layer formed on a thin metal film layer;
   after the step of forming the conductive layer having the prescribed pattern, roughening the one area of said first insulating layer where said conductive layer is not present without roughening the one area of said first insulating layer where said conductive layer is present surface roughness of the roughened area of the first insulating layer being at least 0.1 µm; and
   forming a second insulating layer on the at least one of the two major surfaces of said first insulating layer such that said second insulating layer covers said conductive layer and comes into contact with the roughened area of said first insulating layer.

5. A method of manufacturing a printed circuit board, comprising the steps of:
   forming a first conductive layer in a first region on one major surface of a first insulating layer and forming a second conductive layer in a second region on the one major surface of the first insulating layer, the first and second conductive layers being spaced apart from each other, each of the first and second conductive layers including a metal plating layer formed on a thin metal film layer;
   after the step of forming the first and second conductive layers, roughening a third region of the first insulating layer that extends between the first and second regions without roughening of the first and second regions, a surface roughness of the roughened third region being at least 0.1 µm; and
   forming a second insulating layer on the one major surface of the first insulating layer such that the second insulating layer covers the first and second conductive layers and comes into contact with the roughened third region.

* * * * *